United States Patent [19]
Sanwo et al.

[11] Patent Number: 5,436,793
[45] Date of Patent: Jul. 25, 1995

[54] APPARATUS FOR CONTAINING AND COOLING AN INTEGRATED CIRCUIT DEVICE HAVING A THERMALLY INSULATIVE POSITIONING MEMBER

[75] Inventors: Ikuo J. Sanwo, San Marcos; John Flavin, San Diego, both of Calif.

[73] Assignee: NCR Corporation, Dayton, Ohio

[21] Appl. No.: 41,066

[22] Filed: Mar. 31, 1993

[51] Int. Cl.⁶ .................................. H05K 7/20
[52] U.S. Cl. .................... 361/689; 257/717; 257/795; 361/707
[58] Field of Search .......... 439/485; 62/3.1, 418, 62/513; 174/15.1, 252; 257/706, 707, 709, 712, 713, 714, 717, 792, 795; 165/80.2, 80.3, 80.4, 185, 104.33; 361/689, 690, 699, 704, 707

[56] References Cited

U.S. PATENT DOCUMENTS

| | | |
|---|---|---|
| 2,863,994 | 12/1958 | Kohring . |
| 2,881,370 | 4/1959 | Colson . |
| 3,942,010 | 3/1976 | Peterson .................. 250/352 |
| 4,010,489 | 3/1977 | Bourbeau .................. 357/82 |
| 4,253,515 | 3/1981 | Swiatosz .................. 165/61 |
| 4,285,002 | 8/1981 | Campbell . |
| 4,447,842 | 5/1984 | Berg ........................ 361/386 |
| 4,730,665 | 3/1988 | Cutchaw . |
| 4,758,926 | 7/1988 | Herrell et al. . |
| 4,805,420 | 2/1989 | Porter et al. . |
| 4,926,242 | 5/1990 | Itoh et al. . |
| 4,950,181 | 8/1990 | Porter . |
| 5,032,897 | 7/1991 | Mansuria et al. . |
| 5,034,688 | 7/1991 | Moulene .................. 324/158 F |
| 5,111,277 | 5/1992 | Medeiros, III et al. . |

*Primary Examiner*—Gerald P. Tolin
*Attorney, Agent, or Firm*—Paul J. Maginot

[57] ABSTRACT

An apparatus for containing and cooling an integrated circuit device includes a container defining a chamber. The apparatus further includes a conduit positioned in the chamber and having an inner surface and an outer surface, the integrated circuit device being positionable in the chamber and securable to the outer surface of the conduit. In addition, the apparatus includes an insulating member positioned to provide thermal isolation between the container and the conduit.

11 Claims, 3 Drawing Sheets

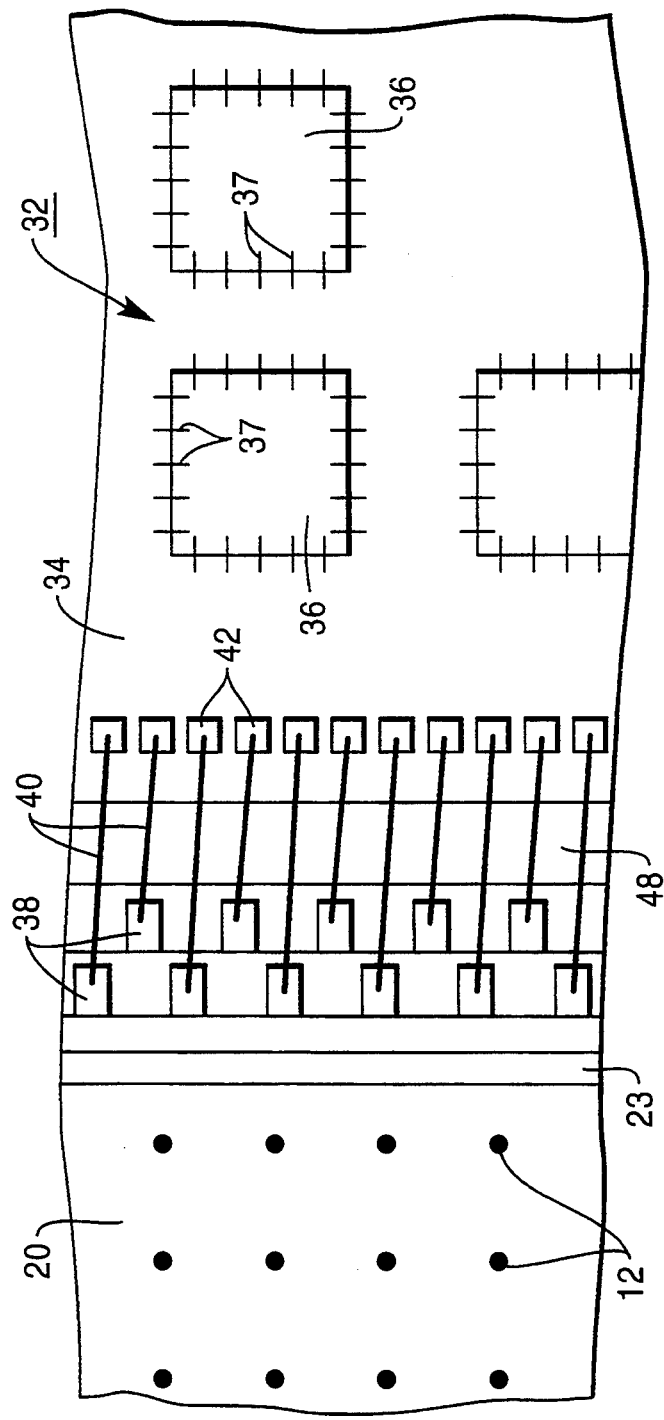

APPARATUS FOR CONTAINING AND COOLING AN INTEGRATED CIRCUIT DEVICE HAVING A THERMALLY INSULATIVE POSITIONING MEMBER

CROSS REFERENCE

Cross reference is made to U.S. patent application, Ser. No. 08/040,688, filed concurrently herewith and entitled "Containing and Cooling Apparatus for an Integrated Circuit Device having a Thermal Insulator," which is assigned to the same assignee as the present invention.

BACKGROUND OF THE INVENTION

The present invention relates to cooling mechanisms and, more particularly, to an apparatus for containing and cooling an integrated circuit device.

It is well known that the performance of some electronic devices can be improved by cooling them to a low temperature, and even to a temperature below 0° C. As a result, a variety of devices have been designed to cool integrated circuit devices. For example, U.S. Pat. No. 4,730,665 discloses an apparatus for cooling a high-density integrated circuit device. This apparatus includes a housing in which the circuit device is sealingly mounted in an internal chamber of the housing. The chamber is at least partially filled with a plurality of thermally conductive spheroids which are biased into thermally conductive contact with each other and with the integrated circuit device to maximize the heat exchange surface. This apparatus further includes an inlet and an outlet for passing a dielectric immersion coolant through the chamber in direct heat exchange relationship with the spheroids and with the high-density integrated circuit device. Another example is shown in U.S. Pat. No. 4,758,926 which describes a device for enclosing, protecting and cooling semiconductor integrated circuit chips. The device includes a generally planar substrate with the chips positioned thereon. Signal connections are provided between at least some of the chips. A heat sink is positioned in contact with the chips and includes microchannels through which a cooling fluid flows for purposes of transferring heat generated by the chips to such fluid. Manifolds are provided to direct the fluid to and from the microchannels, and microcapillary slots may be formed on the heat sink surface adjacent the chips to receive liquid to generate attractive forces between the heat sink and chips to facilitate heat transfer. Circuitry is provided to distribute power through the device and to the chips. Yet another example is shown in U.S. Pat. No. 5,032,897 which discloses a thermoelectrically cooled integrated circuit package which includes an insulative module which defines a cavity. A thermoelectric cooler is positioned within the cavity, and an integrated circuit chip is connected to the thermoelectric cooler.

However, a problem which may be encountered with the aforementioned devices is the formation of frost on the surface thereof during low temperature operation, Such problem may result in water developing on the printed circuit board which may cause structural damage thereto or shorting of the electrical circuitry thereon. Also, the aforementioned devices may be relatively difficult and expensive to manufacture.

SUMMARY OF THE INVENTION

In accordance with one embodiment of the present invention, there is provided an apparatus for containing and cooling an integrated circuit device which includes a container defining a chamber. The apparatus further includes a conduit positioned in the chamber and having an inner surface and an outer surface, the integrated circuit device being positionable in the chamber and securable to the outer surface of the conduit. In addition, the apparatus includes an insulating member positioned to provide thermal isolation between the container and the conduit.

Pursuant to another embodiment of the present invention, there is provided an apparatus for containing and cooling an integrated circuit device. The apparatus includes a container defining a chamber and a heat sink assembly positioned in the chamber, the integrated circuit being positionable in the chamber and securable to the heat sink assembly. The apparatus further includes a mechanism for thermally isolating the heat sink assembly from the container.

In accordance with yet another embodiment of the present invention, there is provided an apparatus for containing and cooling an integrated circuit device. The apparatus includes a container defining a chamber and a conduit positioned in the chamber and having a first portion and a second portion, the integrated circuit device being positionable in the chamber and securable to the second portion of the conduit. The apparatus further includes an insulator positioned to provide thermal isolation between the container and the conduit.

In accordance with still another embodiment of the present invention, there is provided an apparatus for containing and cooling an integrated circuit device which includes a container defining a chamber and a heat sink positioned in the chamber, the integrated circuit device being positionable in the chamber and securable to the heat sink. The apparatus additionally includes an insulator positioned to provide thermal isolation between the container and the heat sink.

It is therefore an object of the present invention to provide a new and useful apparatus for containing and cooling an integrated circuit device.

It is another object of the present invention to provide an improved apparatus for containing and cooling an integrated circuit device.

It is yet another object of the present invention to provide an apparatus for containing and cooling an integrated circuit device which encounters substantially less risk of forming frost on the surface thereof.

It is still another object of the present invention to provide an apparatus for containing and cooling an integrated circuit device which does not cause water to develop on an associated printed circuit board.

It is moreover another object of the present invention to provide an apparatus for containing and cooling an integrated circuit device which does not cause structural damage to an associated printed circuit board or electrical shorting of circuitry on the printed circuit board.

It is yet another object of the present invention to proved an apparatus for containing and cooling an integrated circuit device which is relatively easy and inexpensive to manufacture.

The above and other objects, features, and advantages of the present invention will become apparent

BRIEF DESCRIPTION OF THE DRAWINGS

FIG. 3 is an enlarged fragmentary bottom elevational view of the apparatus for containing and cooling an integrated circuit device of FIG. 1 with the cover of the apparatus removed for clarity of description.

DETAILED DESCRIPTION OF THE PREFERRED EMBODIMENT

Figure 1:
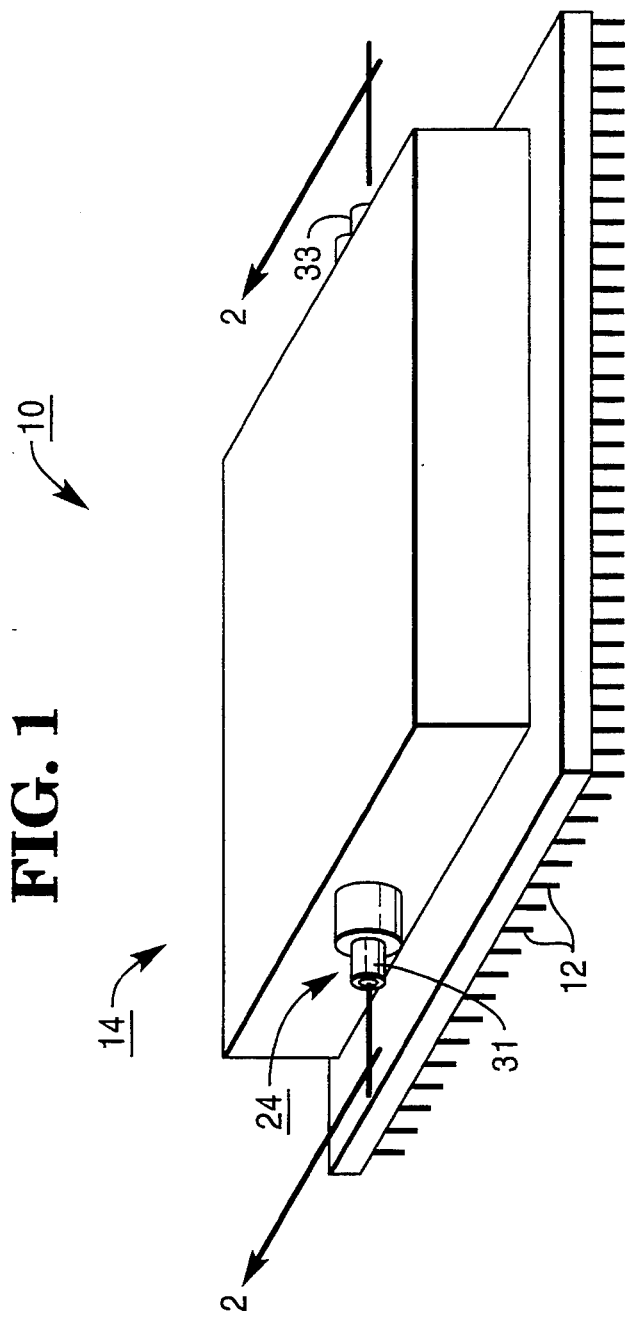
FIG. 1 is a perspective view of an apparatus for containing and cooling an integrated circuit device incorporating the features of the present invention therein.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

Referring now to FIG. 1, there is shown an apparatus for containing and cooling an integrated circuit device, generally indicated by the reference numeral 10. Apparatus 10 is mountable on a printed circuit board (not shown). Apparatus 10 includes a plurality of conductive pins 12 which extend downwardly therefrom. The conductive pins 12 are connectable to various electrical components (not shown) as is well known in the art.

Figure 2:
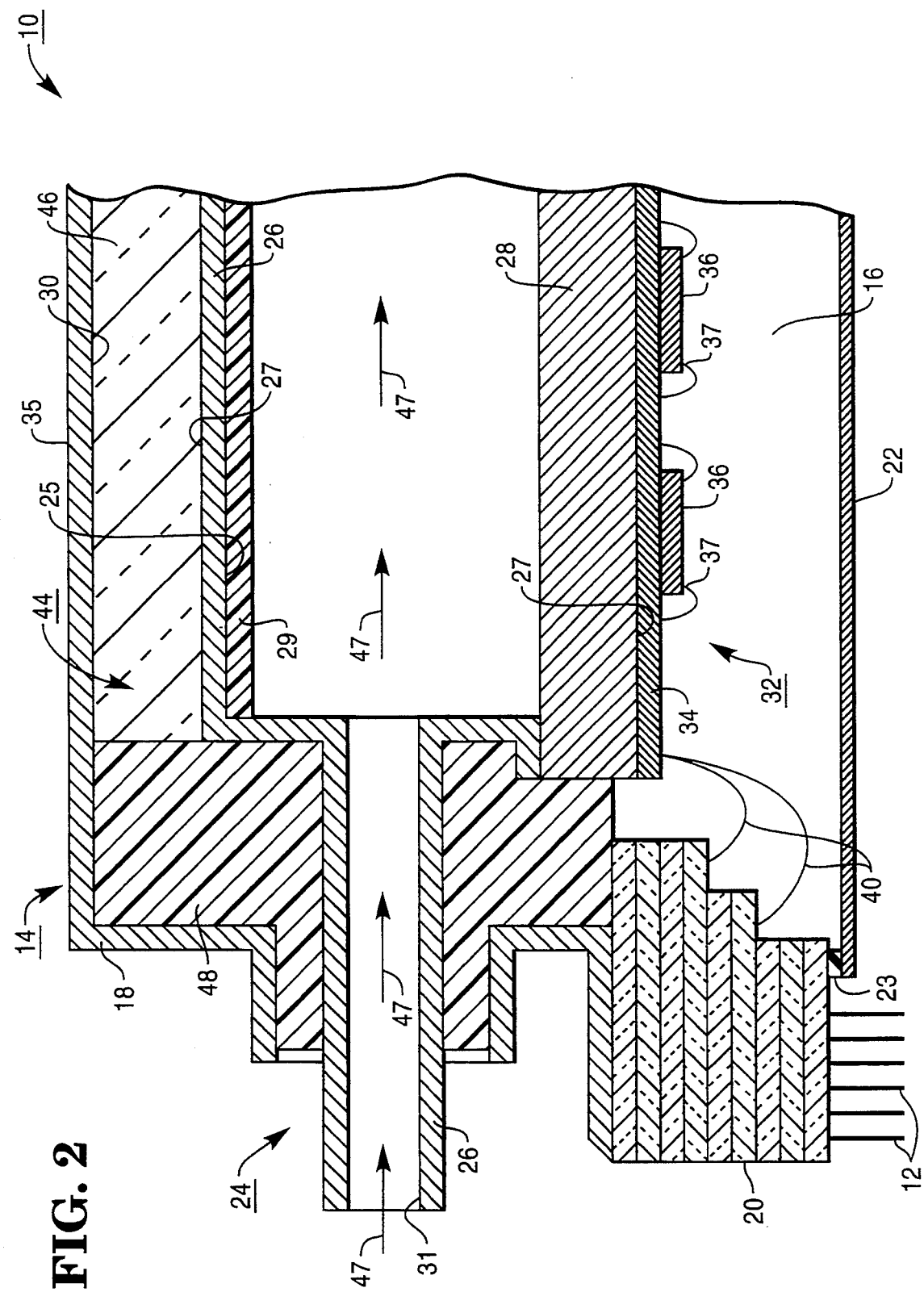
FIG. 2 is an enlarged fragmentary sectional view taken in the direction of arrows 2—2 of FIG. 1.

As shown in FIG. 2, the apparatus 10 includes a container 14 which defines a chamber 16. The container 14 includes a top member 18, a side member 20 and a cover 22. In addition, the container 14 has an inner surface 30 and an outer surface 35. The top member 18 is made of a copper tungsten material while the side member 20 and the cover 22 are both made of a ceramic material which is preferably alumina. The top member 18 is secured to the side member 20 by brazing. A hermetic seal 23 is interposed between the side member 20 and the cover 22. The hermetic seal 23 may be made of a solder material or a high temperature epoxy material. A conduit 24 is positioned in the chamber 16 of the container 14 and extends therethrough. The conduit 24 includes an inlet 31 and an outlet 33 (see also FIG. 1). The conduit 24 further includes a top member 26 and a bottom member 28. The top member 26 is made of a copper tungsten material and the bottom member 28 is made of a copper tungsten material. The top member 26 is secured to the bottom member 28 by brazing. The conduit 24 has an inner surface 25 and an outer surface 27. An insulating layer 29 is positioned on the inner surface 25 of the top member 26 of the conduit 24 as shown in FIG. 2. The insulating layer 29 is made of a polystyrene foam plastic material. By way of example, the insulating layer 29 can be made from Styrofoam, a trademark of Dow Chemical Corporation of Midland, Mich.

An integrated circuit device, generally indicated by the reference numeral 32, is positioned in the chamber 16 and secured to the bottom member 28 and outer surface 27 of conduit 24 as shown in FIG. 2. The integrated circuit device 32 may be secured to the outer surface 27 by an epoxy material. The integrated circuit device 32 is a multi-chip module which includes a substrate 34 and a plurality of individual integrated circuit chips 36 (see FIGS. 2 and 3). The substrate 34 is made of a silicon material. Each of the plurality of integrated circuit chips 36 is secured to the substrate 34 by an epoxy material. The conductive pins 12 are electrically connected to a number of terminals 37 of the integrated circuit chips 36 via a number of electrical traces 38 (partially internal to side member 20), a number of bond wires 40, and a number of electrical traces 42 (partially internal to substrate 34).

The apparatus 10 further includes an insulating member 44 positioned to provide thermal isolation between the container 14 and the conduit 24. In particular, the insulating member includes a first insulating portion 46 and a second insulating portion 48. The first insulating portion 46 is made of a ceramic material, and the ceramic material is porcelain. The second insulating portion 48 is made of a polystyrene foam plastic material. By way of example, the second insulating portion can be made from Styrofoam, a trademark of Dow Chemical Corporation of Midland, Mich. The insulating member 44, which includes the first and second insulating portions, has a high thermoresistance relative to the thermoresistance of ambient room air. The first insulating portion 46 is secured by brazing to the inner surface 30 of the container 14, and further, the first insulating portion is secured by brazing to the outer surface 27 of the conduit 24. As a result, the conduit 24 is rigidly fixed within the container 14. This feature is advantageous since during the process of attaching the bond wires 40 within the apparatus 10, significant pressure is applied to the conduit 24. Without the aforementioned structure which provides mechanical support to the conduit 24, the arrangement within the container 14 could be damaged during the above process. For example, some of the bond wires 40 which extend between the side member 20 and the substrate 34 could be broken.

During operation of the apparatus 10, a coolant (not shown), which may be a liquid or gaseous refrigerant, is advanced in the direction of arrows 47 through the conduit 24 by entering at inlet 31 and exiting at outlet 33. As the coolant is advanced through conduit 24, thermal energy will be transferred by conduction from the integrated circuit device 32 to the conduit 24 which is in thermally conductive contact with the coolant. In turn, thermal energy will be transferred by conduction from the conduit 24 to the coolant which is then advanced out of the apparatus 10 thereby resulting in substantial cooling of the integrated circuit device 32.

Note that the insulator 44 provides thermal isolation between the container 14 and the conduit 24 since the insulator 44 has a high thermoresistance and it positions the conduit 24 in spaced apart relationship from the container 14. The above arrangement effectively eliminates any low thermoresistance paths between the conduit 24 and the container 14. This significantly reduces the amount of thermal energy which is transferred from the conduit 24 to the container 14 which thereby substantially lessens the risk of frost formation on the outer surface 35 of the container 14.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the invention is herein described as containing and cooling an integrated circuit device which includes a plurality of individual integrated circuit chips, however, the invention is equally applicable to containing and cooling an integrated circuit device which possesses only one integrated circuit chip.

What is claimed is:

1. An integrated circuit package, comprising:
   a container closed on all sides and defining an enclosed chamber;
   a conduit positioned within the enclosed chamber and having an inner surface and an outer surface;
   an integrated circuit device being positioned within the enclosed chamber and secured to the outer surface of said conduit; and
   an insulating member positioned within the enclosed chamber so as to provide thermal isolation between said container and said integrated circuit device, wherein said conduit is spaced apart from said container.

2. The apparatus of claim 1, wherein said conduit includes a first portion and a second portion, and further wherein said insulating member substantially surrounds the first portion of said conduit.

3. The apparatus of claim 2, further comprising a second insulating member positioned on the first portion and inner surface of said conduit.

4. The apparatus of claim 1, wherein said conduit has an inlet and an outlet so as to allow a coolant to be advanced therethrough.

5. The apparatus of claim 1, wherein said container has an inner surface, and further wherein said insulating member is secured between the inner surface of said container and the outer surface of said conduit.

6. The apparatus of claim 5, wherein said insulating member includes a ceramic material interposed between the inner surface of said container and the outer surface of said conduit.

7. An integrated circuit package, comprising:
   a container closed on all sides and defining an enclosed chamber;
   a conduit positioned within the enclosed chamber and having a first portion and a second portion;
   an integrated circuit device being positioned within the enclosed chamber and secured to and in direct contact with the second portion of said conduit; and
   an insulator positioned within the enclosed chamber so as to provide thermal isolation between said container and said integrated circuit device., wherein said conduit is spaced apart from said container.

8. The apparatus of claim 7, wherein said insulator substantially surrounds the first portion of said conduit.

9. The apparatus of claim 7, wherein said insulator is secured between said container and said conduit.

10. The apparatus of claim 7, wherein the first portion of said conduit has an inner surface, and further wherein a second insulator is secured thereto.

11. The apparatus of claim 7, wherein said insulator includes a ceramic material interposed between said conduit and said container.

* * * * *